(12) United States Patent
Ariyoshi

(10) Patent No.: US 6,907,054 B2
(45) Date of Patent: Jun. 14, 2005

(54) SEMICONDUCTOR LASER DEVICE

(75) Inventor: Akira Ariyoshi, Nara (JP)

(73) Assignee: Sharp Kabushiki Kaisha, Osaka (JP)

(*) Notice: Subject to any disclaimer, the term of this patent is extended or adjusted under 35 U.S.C. 154(b) by 85 days.

(21) Appl. No.: 10/184,964

(22) Filed: Jul. 1, 2002

(65) Prior Publication Data

US 2003/0031217 A1 Feb. 13, 2003

(30) Foreign Application Priority Data

Jun. 29, 2001 (JP) ........................... 2001-199101

(51) Int. Cl.⁷ .............................................. H01S 3/04
(52) U.S. Cl. ................................................... 372/36
(58) Field of Search ........................... 372/36, 44, 49; 385/49

(56) References Cited

U.S. PATENT DOCUMENTS

| | | | | |
|---|---|---|---|---|
| 5,362,673 A | * | 11/1994 | Iechi | 438/24 |
| 5,486,263 A | * | 1/1996 | Dautremont-Smith et al. | 216/33 |
| 5,559,918 A | * | 9/1996 | Furuyama et al. | 385/92 |
| 5,627,851 A | * | 5/1997 | Takahashi | 372/44 |
| 6,229,831 B1 | * | 5/2001 | Nightingale et al. | 372/36 |
| 6,278,681 B1 | * | 8/2001 | Nagano | 369/112.16 |
| 6,449,296 B1 | * | 9/2002 | Hamasaki et al. | 372/36 |
| 6,567,590 B1 | * | 5/2003 | Okada et al. | 385/49 |
| 6,754,244 B2 | * | 6/2004 | Roellig et al. | 372/36 |
| 2001/0022796 A1 | * | 9/2001 | Okada et al. | 372/49 |
| 2002/0105981 A1 | * | 8/2002 | Gen-ei et al. | 372/36 |

FOREIGN PATENT DOCUMENTS

| | | | | |
|---|---|---|---|---|
| EP | 000826993 A1 | * | 3/1998 | |
| JP | 61-250845 | | 11/1986 | |
| JP | 62-026653 | | 2/1987 | |
| JP | 62026653 | * | 2/1987 | ............ G11B/7/13 |
| JP | 63-175490 | | 7/1988 | |
| JP | 08-037339 | | 1/1996 | |

\* cited by examiner

Primary Examiner—Don Wong
Assistant Examiner—Hung Tran Vy
(74) Attorney, Agent, or Firm—Morrison & Foerster LLP

(57) ABSTRACT

A semiconductor laser device has a laser chip and a submount therefor. The submount has a fore end surface inclined in a direction of thickness of the submount. The laser chip is mounted on the submount in such a manner that an edge line of the fore end surface is perpendicular to a light emission axis of the laser chip, and that a light-emitting end surface of the laser chip projects from the edge line by a projection length in the direction of the light emission axis of the laser chip. Thereby, the laser chip receiving no return light is easily positioned with high accuracy.

7 Claims, 3 Drawing Sheets

SEMICONDUCTOR LASER DEVICE

BACKGROUND OF THE INVENTION

The present invention relates to a semiconductor laser device used for an optical pickup of a 3-beam tracking system or the like in an optical disk system, for example.

Conventionally, as a semiconductor laser device used for an optical pickup of 3-beam tracking system in an optical disk system, there has been the device as shown in the plan view of FIG. 4 (refer to Japanese Patent Laid-Open Publication No. SHO 63-175490). In this semiconductor laser device 100, a laser chip 102 is die-bonded onto a submount 101. The submount has a fore end surface 103. In a plane view, an acute angle is formed between a fore end surface 103 and a light-emitting end surface 105 of the laser chip. With this arrangement, light incident on the fore end surface 103 of the submount as indicated by the arrow A is reflected in a direction different from the direction of the light emission axis of the laser chip 102 as indicated by the arrow B.

Light is emitted from the laser chip and condensed on an optical disk by an optical system, and part of the light, a sub-beam in particular, is reflected on this optical disk to return to the semiconductor laser device 100 via the optical system as return light. Then, by the above-mentioned way, the return light is prevented from being reflected in the direction of light emission of the laser chip on the fore end surface of the submount. This prevents reduction of the S/N (signal-to-noise) ratio of a signal read by the optical pickup, which reduction is derived from the fact that the return light reaches the optical disk again via the optical system to be detected by a light-receiving element.

FIG. 5 is a plan view showing another conventional semiconductor laser device (Japanese Patent Laid-Open Publication No. SHO 62-26653). In the plane view of the semiconductor laser device 110, a laser chip 112 is mounted on a submount 111 in such a manner that an acute angle is formed between an edge line of the rectangular submount 111 and an edge line of the rectangular laser chip 112. That is, the acute angle is formed between the fore end surface 113 of the submount and the light-emitting end surface 115 of the laser chip. This arrangement prevents the return light from reaching the optical disk again via the optical system by reflecting the return light incident on the semiconductor laser device 110 as indicated by the arrow C in a direction different from the direction of the light emission axis of the laser chip 112 as indicated by the arrow D.

However, the conventional semiconductor laser device 100 of FIG. 4 has a problem of difficulty in fabrication since it is required to determine the die-bonding position of the laser chip 102 to the submount 101 with high accuracy. This is because the heat release of the laser chip 102 changes when changing projection length 107, the distance from the fore end surface of the submount 101 to the light-emitting side of the laser chip in the light-emitting region 106 of a laser chip as shown in FIG. 6, and thereby changing the characteristics of the operating current value, reliability and so on of the semiconductor laser device change. It is required to form the projection length 107 with high accuracy (tolerance of about 15 μm). In this case, the fore end surface 103 of the submount 101 is inclined relative to the light-emitting end surface 105 of the laser chip 102 in a plane view. Therefore, in order to set the projection length 107 to a prescribed amount, it is required to determine, with high accuracy, a position in the direction of the light emission axis of the laser chip 102 and a position of the laser chip in the direction perpendicular to the light emission axis with respect to the submount 101. This leads to the problem of difficult fabrication. This problem occurs similarly in the semiconductor laser device shown in FIG. 5.

Furthermore, in the case of a semiconductor laser device 120 of a hybrid-type dual-wavelength light source in which two laser chips 122 and 122 are mounted on one submount 121 as shown in FIG. 7, it is required to determine not only the projection lengths 127 and 127 of the laser chips 121 and 121 from the inclined fore end surface 123 of the submount but also the isolation 128 in the direction of the light emission axis between the light-emitting end surfaces 125 and 125 of the laser chips with high accuracy (tolerance of about 10 μm). This makes the fabrication of the semiconductor laser device very difficult.

SUMMARY OF THE INVENTION

Accordingly, an object of the present invention is to provide a semiconductor laser device which does not reflect the return light in the direction of the light emission axis and is comparatively easily fabricated.

In order to achieve the aforementioned object, the present invention provides a semiconductor laser device comprising:

a laser chip; and a submount on which the laser chip is die-bonded, wherein an edge line of a fore end surface of the submount, which edge line is located on a side of the laser chip, is perpendicular to a light emission axis of the laser chip, and wherein the fore end surface includes a plane surface inclined in a direction of thickness of the submount, or the fore end surface is a curved surface, and wherein both the plane surface and the curved surface reflect return light in a direction different from a direction of the light emission axis.

According to the semiconductor laser device of the above-mentioned construction, the laser chip is mounted on the submount in such a manner that the edge line of the laser chip at the fore end surface of the submount the side is perpendicular to the light emission axis of the laser chip. Therefore, the mounting of the laser chip on this submount is positioned comparatively easily. Specifically, when the laser chip projects from the edge line of the fore end surface of the submount in the direction of the light emission axis of the laser chip, it is required to determine only a projection length from the edge line of the fore end surface of the submount to a light-emitting end surface of the laser chip with high accuracy. In other words, the position of the laser chip is determined only in the direction of the light emission axis with high accuracy. In this semiconductor laser device, therefore, it is not required to determine both the position in the direction of the light emission axis of the laser chip and the position perpendicular to the light emission axis with high accuracy, dissimilar to the case of the conventional semiconductor laser device in which the light-emitting end surface of the laser chip is inclined with respect to the fore end surface of the submount in a plane. Thus, this semiconductor laser device can be fabricated more easily than in the conventional case.

Moreover, since the fore end surface of the submount is a plane surface inclined in the direction of thickness of the submount or includes a curved surface, the plane surface or the curved surface reflects the return light in a direction different from the direction of the light emission axis. Therefore, when this semiconductor laser device is used for, for example, the light source of the optical pickup of an optical disk, the return light from the optical disk is effectively prevented from reaching again the optical disk, effectively preventing the reduction in the S/N ratio of the signal read by the optical pickup.

In the semiconductor laser device of one embodiment, a plurality of said laser chips are mounted on the submount.

According to the above-mentioned embodiment, since a plurality of laser chips are mounted on the submount, the hybrid type semiconductor laser device capable of emitting light of a multiplicity of wavelengths with one package can be constituted. Furthermore, since it is required to set the positions only in the direction of the light emission axes of the plurality of laser chips with high accuracy, the device can be fabricated simply at low cost.

In one embodiment of the present invention, a cross-section of the submount in the direction of the light emission axis is trapezoidal.

According to the above-mentioned embodiment, the submount has a trapezoidal cross-section in the direction of the light emission axis. Therefore, this submount effectively reflects the return light in a direction different from the direction of the light emission axis. Thereby, there can be provided the semiconductor laser device suitable for, for example, the light source of the optical pickup of an optical disk.

In one embodiment of the present invention, the submount is comprised of a semiconductor, and the fore end surface of the submount is formed by dicing.

According to the above-mentioned embodiment, the submount constructed of a semiconductor is easily made to have the prescribed cross-section shape by dicing.

In one embodiment of the present invention, the submount is comprised of a semiconductor whose principal surface is offset from a low index plane, and the fore end surface of the submount is formed by scribing.

According to the above-mentioned embodiment, the surface inclined with respect to the principal surface is formed by scribing on the semiconductor of which the principal surface is offset from the low index plane. Thereby, there can easily be formed the submount having the fore end surface inclined at the prescribed angle with respect to the direction of thickness.

In one embodiment of the present invention, the curved surface is a convex surface or a concave surface.

According to the above-mentioned embodiment, the curved surface in the fore end surface of the submount is a convex surface or a concave surface. Therefore, the return light is effectively reflected in a direction different from the direction of the light emission axis. Thereby, there can be provided the semiconductor laser device suitable for, for example, the light source of the optical pickup of an optical disk.

In one embodiment of the present invention, the submount is comprised of a semiconductor, and the curved surface is formed by etching.

According to the above-mentioned embodiment, the fore end surface of the submount constructed of a semiconductor is easily made to have the prescribed cross-section shape by etching.

In one embodiment of the present invention, the submount is comprised of a semiconductor, and the curved surface is formed by means of a laser marker.

According to the above-mentioned embodiment, the submount constructed of a semiconductor is easily made to have the prescribed section shape by means of a laser marker.

BRIEF DESCRIPTION OF THE DRAWINGS

The present invention will become more fully understood from the detailed description given hereinbelow and the accompanying drawings which are given by way of illustration only, and thus do not limit the present invention, and wherein.

DETAILED DESCRIPTION OF THE PREFERRED EMBODIMENTS

The present invention will be described in detail below on the basis of embodiments thereof shown in the attached drawings.

Figure 1A:
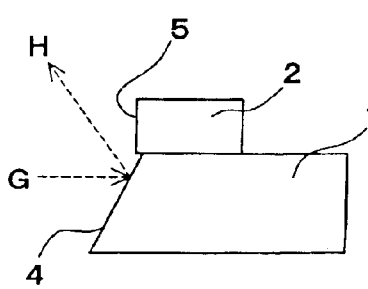
FIG. 1A is a side view of a semiconductor laser device according to a first embodiment of the present invention.

FIG. 1A is a side view of a semiconductor laser device of a first embodiment of the present invention. This semiconductor laser device is constructed of a submount 1 made of a semiconductor and a laser chip 2 die-bonded onto the submount 1. The submount 1 has a fore end surface 4 whose surface is inclined in the direction of thickness of the submount 1.

Figure 1B:
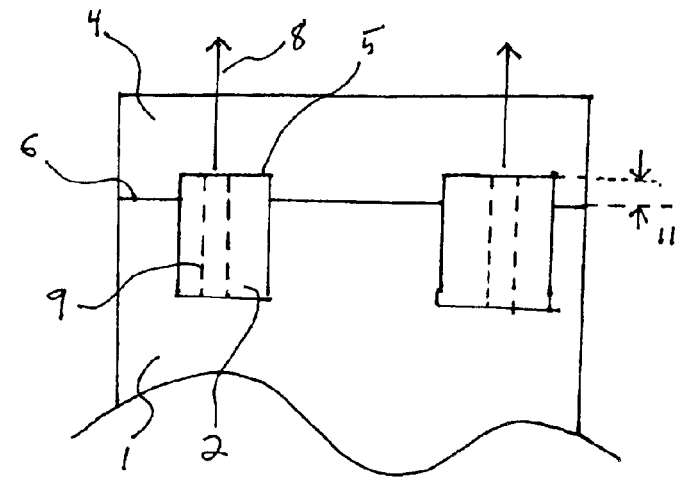
FIG. 1B is a plan view of part of the semiconductor laser device shown in FIG. 1A.

FIG. 1B is a plan view of part of the above-mentioned semiconductor laser device that is rather enlarged than in FIG. 1A. As shown in FIG. 1B, an edge line 6, which belongs to the fore end surface 4 of the submount 1 and is located on the laser chip side, is perpendicular to a light emission axis 8 of the laser chip 2. The light emission axis 8 is roughly aligned with a light-emitting region 9 of the laser chip 2. The laser chip 2 is mounted on the submount 1 in such a manner that its light-emitting end surface 5 projects from the edge line 6 of the fore end surface 4 of the submount 1 by a projection length 11 in the direction of the light emission axis 8. The projection length 11 of the laser chip 2 is such that a prescribed amount of heat of the laser chip 2 is released and consequently the operating current of the laser chip 2 comes to have a prescribed value.

The submount 1 of the semiconductor laser device may have the fore end surface 4 formed by dicing. By using a dicing saw provided with a disk-shaped blade that has a thickness reducing radially outwardly, a semiconductor plate (hereinafter referred to as a semiconductor substrate) is cut with the blade rotating at high speed, so that the cutting surface of this blade forms the fore end surface 4 inclined with respect to the direction of thickness. This submount 1, of which the fore end surface 4 is formed by means of the reducing thickness blade of the dicing saw, can therefore be fabricated simply at low cost.

In the above-mentioned semiconductor laser device, the laser chip 2 is mounted on the submount 1 in such a manner that the light emission axis 8 of the laser chip 2 is perpendicular to the edge line 6, which belongs to the fore end surface 4 of the submount 1 and is located on the laser chip side. Therefore, the mounting of the laser chip 2 on the submount 1 can be positioned comparatively easily. In other words, the projection length 11 of the laser chip 2 is determined with high accuracy by positioning the laser chip 2 on the submount 1 accurately only in the direction of the light emission axis 8 of the laser chip 2. Therefore, dissimilar to the conventional semiconductor laser device, it is not required to determine the mounting position of the laser chip with high accuracy in both the direction of the light emission axis and the direction perpendicular to this light emission axis. As a result, the laser chip 2 is mounted on the submount 1 more easily than in the conventional case, and therefore, the semiconductor laser device is easily fabricated.

The above-mentioned semiconductor laser device is placed in an optical pickup of 3-beam tracking system in an optical disk system. This optical pickup is provided with the above-mentioned semiconductor laser device, a light-receiving element and an optical system. The optical system is arranged in the direction of the light emission axis S of the laser chip 2 of the semiconductor laser device so as to condense light from the laser chip 2 on an optical disk and to guide the reflected light from the optical disk to the light-receiving element. If this optical disk system is operated, as shown in FIG. 1B, light is emitted from the laser chip 2 in the direction of the light emission axis 8. The emitted light is split into a main beam and sub-beams by a diffraction grating provided in the optical system. The main beam and the sub-beams are condensed onto the optical disk. The reflected light of this main beam condensed on the optical disk is detected by the light-receiving element, and a reproduction signal is obtained. The reflected light of the sub-beams condensed on the optical disk is detected by the light-receiving element, and a tracking error signal is obtained.

In this optical pickup, there sometimes occurs the so-called return light, which is caused by the reflected light of the main beam and the reflected light of the sub-beams returning to the semiconductor device via the optical system. As indicated by the arrow G in FIG. 1A, this return light is incident on the submount 1 of the semiconductor device. However, since the fore end surface 4 of the submount 1 is inclined in the direction of thickness, the return light is reflected in the direction of the arrow H different from the direction of the light emission axis 8 of the laser chip 2. This reliably prevents the reduction in the S/N ratio of the signal detected by the optical pickup because the return light reaches again the optical disk via the optical system so as to be detected by the light-receiving element.

While the fore end surface 4 of the submount 1 of the semiconductor laser device may be formed by dicing, it may also be formed by scribing a semiconductor substrate of which the principal surface is offset from the low index plane, i.e., an offset substrate. That is, the submount 1 is formed by using a semiconductor substrate whose surface orientation is offset from the (100) plane, scribing a cutting line on the surface of this semiconductor substrate with a diamond cutter or the like, and cleaving the semiconductor substrate along this cutting line. The cleaved surface is a flat surface inclined in the direction of thickness of the semiconductor substrate along the (100) plane. A semiconductor laser device is obtained by making this cleaved surface serve as the fore end surface 4 and mounting the laser chip 2 on the surface of the semiconductor substrate. The submount 1 is thus easily formed, and the semiconductor laser device suitable for an optical pickup can be fabricated at low cost.

Moreover, the fore end surface 4 may also be made by forming a cutting plane from the surface of the semiconductor substrate to a prescribed distance in the direction of thickness by means of a dicing saw and thereafter breaking the semiconductor substrate through pressurization. In this case, it is proper to set the prescribed distance in the direction of thickness to such a distance that the cutting surface formed by the dicing saw is somewhat greater than the incidence region of the return light. With this arrangement, the return light is securely reflected in the direction different from the light emission axis of the laser chip.

Figure 2A:
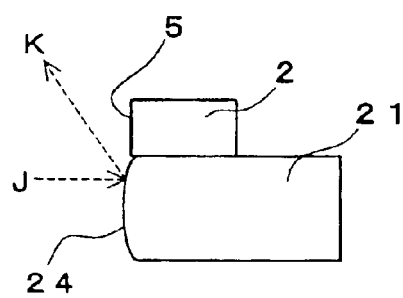
FIG. 2A is a side view of a semiconductor laser device according to a second embodiment of the present invention.
Figure 2B:
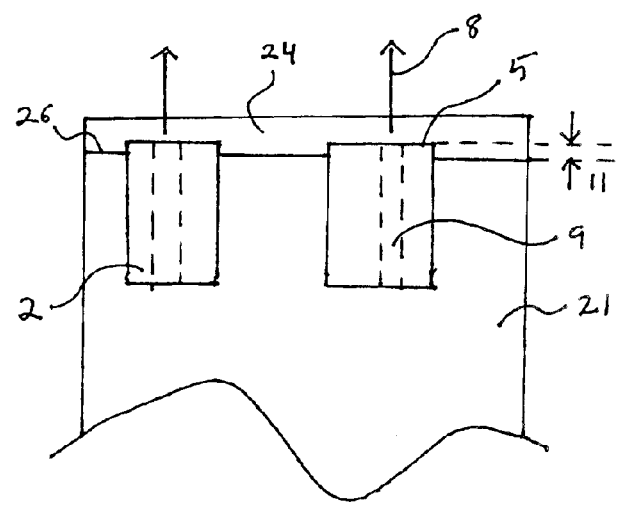
FIG. 2B is a plan view of part of the semiconductor laser device shown in FIG. 2A.

FIG. 2A is a side view of the semiconductor laser device according to a second embodiment of the present invention, while FIG. 2B is a plan view of the semiconductor laser device shown in FIG. 2A. In the semiconductor laser device shown in FIGS. 2A and 2B, elements that have the same functions as those of elements constituting the semiconductor laser device shown in FIGS. 1A and 1B are denoted by same reference numbers, and no detailed description is provided therefor.

This semiconductor laser device may be made of Si (silicon) and is provided with a submount 21 whose fore end surface 24 is a curved surface as shown in FIG. 2A. An edge line 26, which belongs to the fore end surface 24 of the submount 21 and is located on the laser chip side, is perpendicular to the light emission axis 8 of the laser chip 2, as shown in FIG. 2B. The curved fore end surface 24 of the submount 21 may be formed by etching. That is, an end surface portion of a silicon substrate, which has a roughly rectangular cross section, is immersed in an etching liquid such as hydrofluoric so as to remove the corner portions of the end surface portion, so that the cross section of this end surface portion constitutes a curved surface. This takes advantage of the etching characteristic that the progress rate of etching is greater in the corner portions than in the flat portion. Thus, the submount 21 having the cross section shape shown in FIG. 2A is formed by removing the corner portions, the fore end surface 24 of the submount 21 being curved.

In the above-mentioned semiconductor laser device, the laser chip 2 is mounted on the submount 21 so that the light emission axis 8 of the laser chip 2 is perpendicular to the edge line 26, which belongs to the fore end surface 24 of the submount 21 and is located on the laser chip side. Therefore, the mounting of the laser chip 2 on the submount 1 can be comparatively easily positioned. In other words, the projection length 11 is determined with high accuracy by positioning the laser chip 2 on the submount 21 accurately only in the direction of the light emission axis 8 of the laser chip 2. Therefore, the laser chip 2 is mounted on the submount 21 more easily than in the conventional case, and the semiconductor laser device is easily fabricated.

Moreover, in the case that the above-mentioned semiconductor laser device is employed as the light source of an optical pickup, even if the return light from the optical system is incident on the submount 21 of the semiconductor laser device as indicated by the arrow J, the return light is reflected in a direction different from the direction of the light emission axis 8 of the laser chip 2 as indicated by the arrow K. This is because the fore end surface 24 of the submount 21 has the curved surface. Thus, the reduction in the S/N ratio of the detected signal of this optical pickup can effectively be prevented.

The submount 21 may be formed of a semiconductor other than Si. The fore end surface 24 may be formed by using an etching liquid other than hydrofluoric acid. The submount may be constructed of a metal instead of the above-stated semiconductor.

Figure 3A:
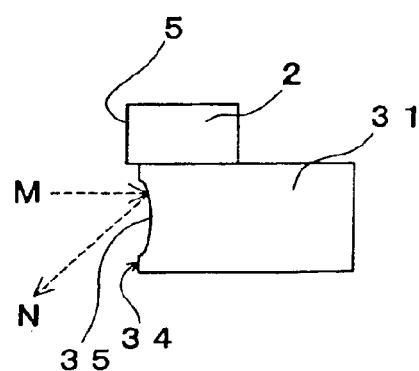
FIG. 3A is a side view of the semiconductor laser device according to a third embodiment of the present invention.
Figure 3B:
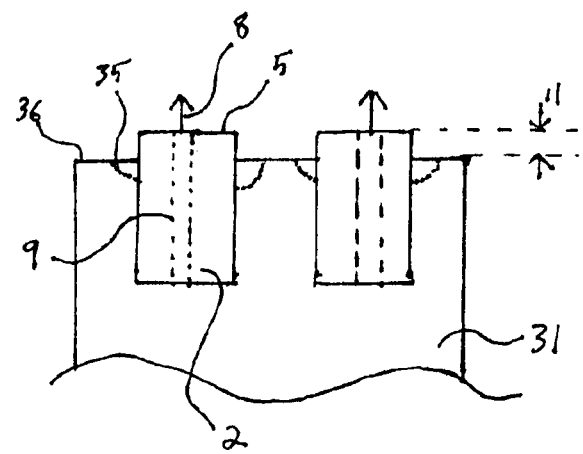
FIG. 3B is a plan view of part of the semiconductor laser device shown in FIG. 3A.
Figure 4:
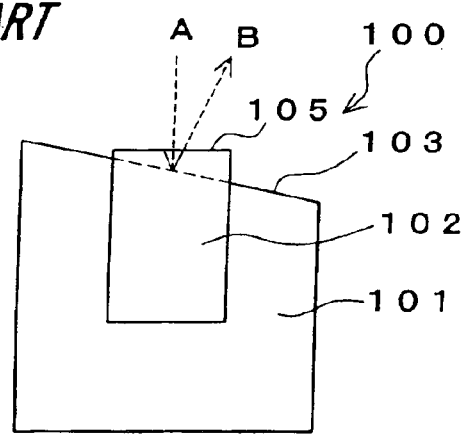
FIG. 4 is a plan view of a conventional semiconductor laser device.
Figure 5:
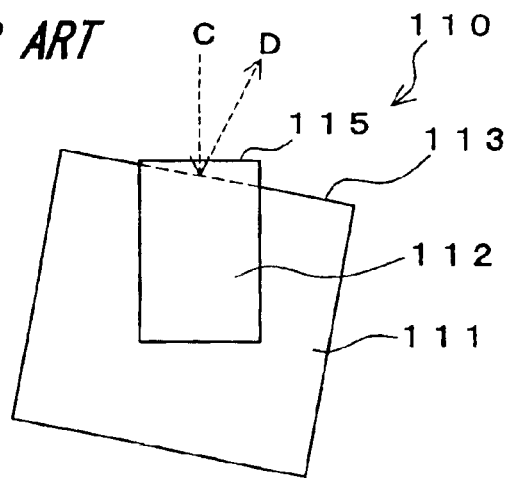
FIG. 5 is a plan view of another conventional semiconductor laser device.
Figure 6:
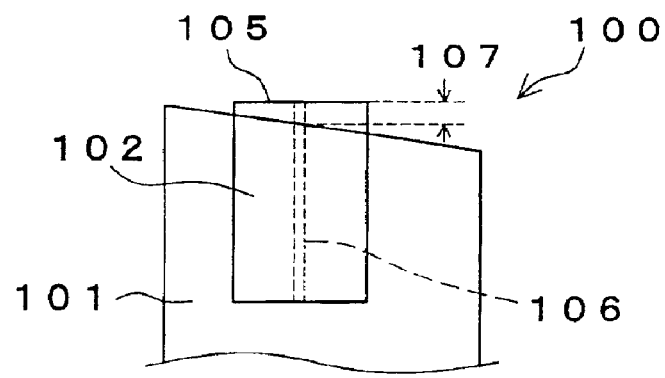
FIG. 6 is a plan view for explaining the projection length of the laser chip in the conventional semiconductor laser device of FIG. 4.
Figure 7:
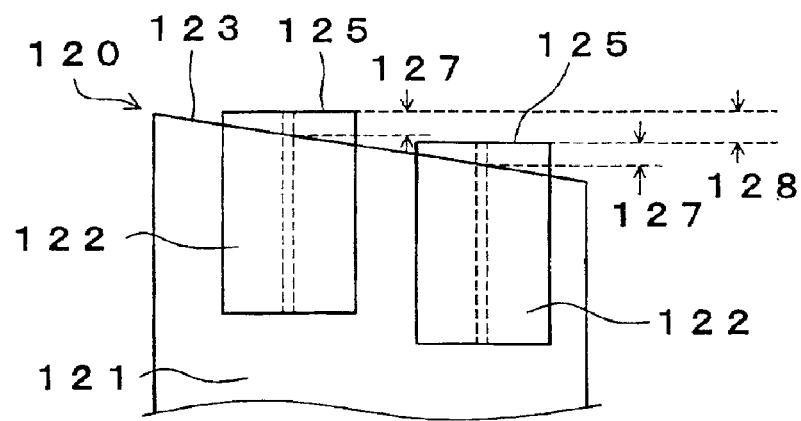
FIG. 7 is a plan view of still another conventional semiconductor laser device.

FIG. 3A is a side view of the semiconductor laser device according to a third embodiment of the present invention. FIG. 3B is a plan view of the semiconductor laser device shown in FIG. 3A. In the semiconductor laser device shown in FIGS. 3A and 3B, elements that have the same functions as those of elements of the semiconductor laser device shown in FIGS. 2A and 2B are denoted by same reference numbers, and no detailed description is provided therefor.

In this semiconductor laser device, the fore end surface 34 of a submount 31 has a recess portion 35 constituted of a curved surface as shown in FIG. 3A. An edge line 36, which belongs to the fore end surface 34 of the submount 31 and is located on the laser chip side, is perpendicular to the light emission axis 8 of the laser chip 2 as shown in FIG. 3B. The submount 31 has the recess portion 35 which is formed by etching the fore end surface 34. Specifically, an end surface 34 of a semiconductor substrate having a rectangular cross-section shape is upwardly placed to drop an etching liquid on the end surface 34, so that the recess portion 35 is formed on the end surface 34 by etching. Then, the semiconductor substrate having the recess portion on the fore end surface 34 is formed as the submount 31, and the laser chip 2 is mounted on the submount 31, constituting the semiconductor laser device. Preferably, the recess portion 35 forms a roughly elliptic shape which has a major axis of about 0.1 mm length in the direction of thickness of the submount 31 and a minor axis of about 0.3 mm length in the direction of width of the submount 31.

In the above-mentioned semiconductor laser device, the laser chip 2 is mounted on the submount 31 so that the light emission axis 8 of the laser chip 2 is perpendicular to the edge line 36 which belongs to the fore end surface 34 of the submount 31 and is located on the laser chip side. Therefore, the mounting of the laser chip 2 on the submount 31 is positioned comparatively easily, so that the light-emitting end surface 5 of the laser chip 2 projects by the length 11 in the direction of the light emission axis 8 from the edge line 36 of the submount. In other words, the projection length 11 is determined with high accuracy by positioning the laser chip on the submount 31 only in the direction of the light emission axis 8 of the laser chip 2. Therefore, the laser chip 2 is mounted on the submount 31 more easily than in the conventional case, and the semiconductor laser device is easily fabricated.

Moreover, in the case that the above-mentioned semiconductor laser device is employed as the light source of an optical pickup, even if the return light from the optical system is incident on the submount 31 of the semiconductor laser device as indicated by the arrow M, the return light is reflected by the recess portion 35 in a direction different from the direction of the light emission axis 8 of the laser chip 2 as indicated by the arrow N. This is because the fore end surface 34 of the submount 31 has the recess portion 35. Thus, the reduction in the S/N ratio of the detected signal of this optical pickup can effectively be prevented.

The recess portion 35, which is formed on the fore end surface 34 of the submount 31, may be formed by the etching liquid as described above. However, the recess portion 35 may also be formed by a laser marker of YAG (yttrium aluminum garnet) laser.

The submount may be formed of a plate made of a conductor or metal instead of the above-mentioned semiconductor substrate.

As described above, the recess portion 35 of the fore end surface 34 is formed in the roughly elliptic shape that has a major axis of about 0.1 mm length in the direction of thickness of the submount 31 and a minor axis of about 0.3 mm length in the direction of width of the submount 31. However, dimensions of the recess portion 35 may appropriately be changed according to the return light. Moreover, the recess portion 35 on the fore end surface 34 is not limited to the elliptic shape and may be formed in a rectangle shape or other shapes.

In the first through third embodiments, one laser chip 2 is mounted on each of the submounts 1, 21 and 31. However, a plurality of laser chips may be mounted on each of the submounts 1, 21 and 31. In this case, the plurality of laser chips can be mounted on each of the submounts 1, 21, 31 while setting the light emission axis of each of laser chips 2 perpendicular to each of the edge lines 6, 26, 36, which belong to the fore end surfaces of the respective submounts 1, 21, 31 respectively and are located on the laser chip side. Therefore, by positioning the laser chips only in the direction of light emission axes of the laser chips with high accuracy, the laser chips can be mounted with high accuracy at less expense in time and effort than in the conventional case.

The invention being thus described, it will be apparent that the invention may be varied in many ways. Such variations are not be regarded as a departure from the spirit and scope of the invention, and all such modifications as would be apparent to one skilled in the art are intended to be included within the scope of the following claims.

What is claimed is:

1. A semiconductor laser device comprising:

two laser chips; and a submount on which the two laser chips are mounted, wherein an edge line of a fore end surface of the submount, which edge line is located on a side of the two laser chips, is perpendicular to a light emission axis of each of the two laser chips, the fore end surface is a curved surface, and the curved surface reflects return light in a direction different from a direction of the light emission axis.

2. A semiconductor laser device as claimed in claim 1, wherein a cross-section of the submount in the direction of the light emission axis is trapezoidal.

3. A semiconductor laser device as claimed in claim 1, wherein the submount is comprised of a semiconductor, and the fore end surface of the submount is formed by dicing.

4. A semiconductor laser device as claimed in claim 1, wherein the submount is comprised of a semiconductor whose principal surface is offset from a low index plane, and the fore end surface of the submount is formed by scribing.

5. A semiconductor laser device as claimed in claim 1, wherein the curved surface is a convex surface or a concave surface.

6. A semiconductor laser device as claimed in claim 5, wherein the submount is comprised of a semiconductor, and the curved surface is formed by etching.

7. A semiconductor laser device as claimed in claim 5, wherein the submount is comprised of a semiconductor, and the curved surface is formed by means of a laser marker.

* * * * *